United States Patent [19]

Avery

[11] 4,374,333
[45] Feb. 15, 1983

[54] TWO TERMINAL HALL-SENSOR

[75] Inventor: Grant D. Avery, Loudon, N.H.

[73] Assignee: Sprague Electric Company, North Adams, Mass.

[21] Appl. No.: 153,800

[22] Filed: May 27, 1980

[51] Int. Cl.³ .................. H03K 3/01; H03K 19/18
[52] U.S. Cl. .................. 307/309; 307/297; 323/294; 323/368
[58] Field of Search .......... 307/309; 323/294, 368, 323/277; 336/6

[56] References Cited

U.S. PATENT DOCUMENTS

| | | | |
|---|---|---|---|
| 3,388,318 | 6/1968 | O'Brien | 323/277 |
| 3,660,696 | 5/1972 | Rittmann | 307/309 |
| 3,816,766 | 6/1974 | Anselmo et al. | 307/309 |
| 3,935,481 | 1/1976 | Uchikawa | 307/309 |

OTHER PUBLICATIONS

New Electron, vol. 12, No. 18, 9/79, Hall Switch Operation Over Two Wires.

Primary Examiner—Stanley D. Miller
Assistant Examiner—B. P. Davis

[57] ABSTRACT

An integrated circuit includes a Hall-element, a voltage regulator, and a threshold detector. DC power is supplied through a pair of terminals that may be connected to a remote DC voltage source. A switchable constant current sink circuit connected across these terminals is turned on and off in response to the two output states of the threshold detector that in turn is responsive to the Hall-element output voltage. Thus the DC current flowing in the two DC supply lines is a predictable large value or small value corresponding to a low and a high magnitude magnetic field at the sensor, even when the supply DC voltage changes over a wide range.

5 Claims, 4 Drawing Figures

TWO TERMINAL HALL-SENSOR

BACKGROUND OF THE INVENTION

This invention relates to Hall-element sensors for detecting magnetic fields that exceed a predetermined strength and more particularly to such a sensor having a Hall-element, a Hall-voltage threshold detector and a pair of DC supply terminals through which the sensor receives electrical energy from a remote source and through which the output signal is transmitted to a remote receiver.

It is known to combine in a package a Hall-element with a Hall-voltage threshold detector including amplifier stages, the packaged circuits receiving electrical energy from a remote DC source through power and ground terminals and transmitting an output signal at a third terminal with respect to the ground terminal. Such a three terminal circuit may be made in integrated-circuit form as is described in the patent to Genesi, U.S. Pat. No. 3,816,766 issued June 11, 1974 that is assigned to the same assignee as is the present invention. This integrated circuit also includes an on-board voltage regulator to provide a substantially fixed voltage to the Hall-element and threshold detector for a large range of remote DC supply voltages.

It is an object of the present invention to provide a Hall-element sensor package having only two terminals through which DC power is received and through which the output signal is transmitted.

SUMMARY OF THE INVENTION

A Hall-sensor having only two terminals is comprised of a Hall-element connected to a threshold detector, a voltage regulator for supplying a regulated DC voltage to the Hall-element, and a constant current load or sink that draws a constant current from the two DC terminals for a low range of ambient magnetic fields and draws at least an order of magnitude less current for a high range of ambient magnetic fields, or vice versa. It is thus possible to sense the DC power supply current drawn at the DC power source itself to determine in which range there exists a magnetic field ambient at the sensor, and only two wires are needed between the sensor and the remote DC source and field indicator. Such a device is anticipated to be especially useful in very low cost automotive tachometers, magnet actuated alarm systems and the like where the cost of each interconnecting wire represents a significant cost element.

DESCRIPTION OF THE PREFERRED EMBODIMENTS

Figure 1:
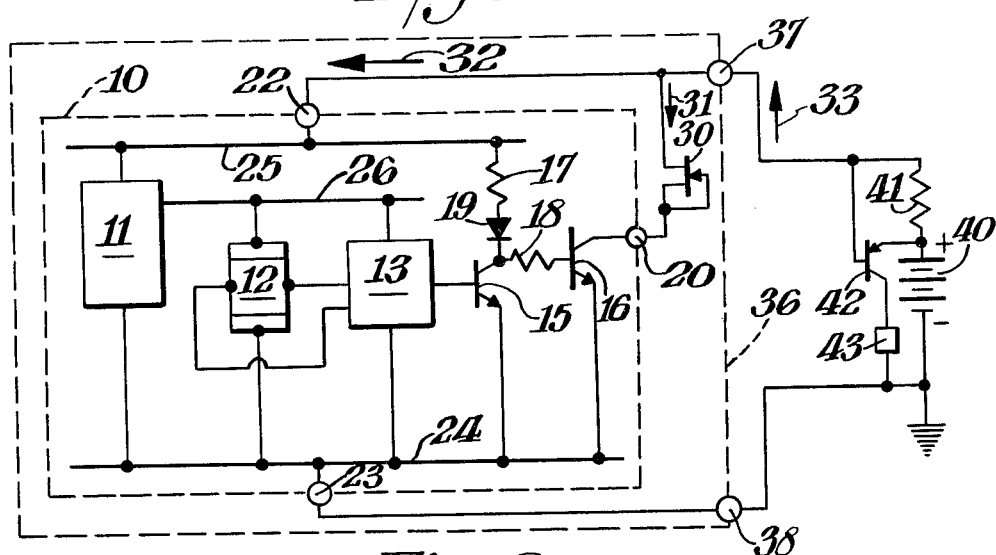
FIG. 1 shows a diagram of a two terminal Hall-sensor of this invention connected to a remote DC power supply and a remote receiver.

With reference to FIG. 1, an integrated circuit 10 includes a voltage regulator 11, a Hall-element 12, a Schmitt trigger circuit 13 and output amplifier stages. The amplifier stages consist of transistors 15 and 16, resistors 17 and 18 and diode 19. The trigger circuit 13 may also include a preamplifier (not specifically shown). Taken together, the trigger circuit, any preamplifier, and following amplifier stages that include transistors 15 and 16 are considered to comprise a Hall-element threshold detector producing an output at terminal 20. DC power is supplied to the integrated circuit 10 through power terminal 22 and ground terminal 23. Terminal 23 is connected internally to a ground buss 24 and terminal 22 is connected to an unregulated voltage buss 25. The voltage regulator being energized from busses 24 and 25 supplies a substantially constant voltage at buss 26 relative to ground buss 24. The Hall-element 12 and threshold detector obtain power from the regulated voltage buss 26.

The integrated circuit 10 of FIG. 1 includes the major features of the three terminal circuit of the above mentioned patent U.S. Pat. No. 3,816,766. Such an integrated circuit, UGN 3020T, is made by the Sprague Electric Company, Worcester, Mass. The regulated voltage between busses 26 and 24 in that commercial product is 3.3 volts for supply voltages ranging from 4.5 to 24 volts applied between terminals 22 and 23. Thus the sensitivity of the Hall-element 12 and the predetermined turn-on threshold voltage of the Schmitt trigger circuit 13 remain constant for a wide range of supply voltages.

A field effect transistor 30 has the gate connected to the source so that it may function as a constant current diode. This FET is connected between the output terminal 20 and power terminal 22 so that when there is a small or no magnetic field at Hall-element 12, the output Hall element voltage seen by the Schmitt trigger circuit 13 is less than the characteristic threshold voltage of the latter, the output amplifier transistor 16 is on and FET transistor 30 draws a current indicated by arrow 31 of about 10 milliamperes from the power busses 24 and 25 whatever the DC voltage appearing there may be (between 4.5 and 24 volts).

When the magnetic field becomes large enough to cause the trigger circuit 13 to change state, the transistor 16 turns off and the current 31 flowing through the constant current diode 30 is zero. For small magnetic fields the current 32 drawn by the integrated circuit 10 from the power supply is about 8.0 milliamperes and for large fields that current 32 is 5.5 milliamperes. The ratio of the total DC supply current 33 at low magnetic fields to that at high magnetic fields (i.e. 18/5.5=3.3) remains substantially constant over a wide range of supply voltages (i.e., about 4.5 to 24 volts) as is indicated graphically in FIG. 4. The curves 34 and 35 represent currents 33 at the high and low magnetic field conditions, respectively.

The above described components may be assembled in a package, indicated by the enclosing dashed-line 36, having two power terminals 37 and 38 that are connected within the package 36 to integrated circuit power terminals 22 and 23, respectively. A battery 40 is connected to these terminals 37 and 38 through a resistor 41 of 47 ohms. A transistor 42 sensing the voltage drop across resistor 41, is off for the condition that total DC power supply current 33 is less than about 14 milliamperes, but turns on when current 33 is greater than 14 milliamperes.

Responder block 43 in the collector circuit of transistor 42 represents an indicator such as a lamp or bell, or block 43 may be an actuator such as a relay or electro mechanical transducer to initiate a desired action in response to changes in state of the Hall-sensor.

Figure 2:
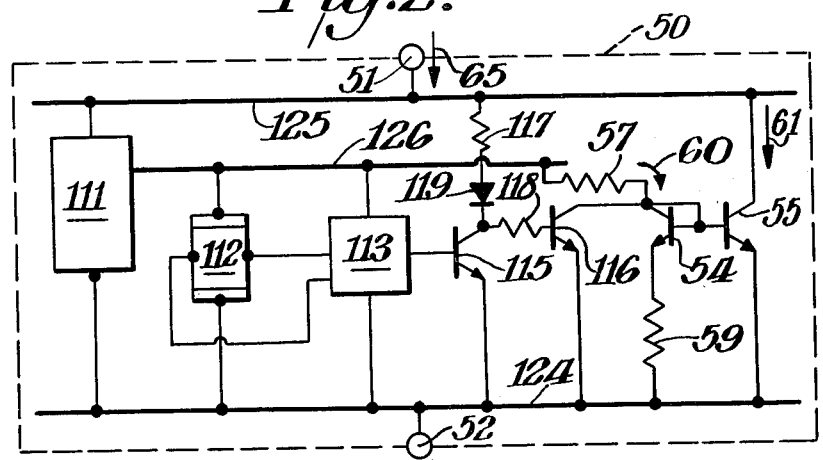
FIG. 2 shows a diagram of another two terminal Hall-sensor of this invention.

Another Hall-sensor of this invention is shown in FIG. 2, and is represented as an entirely integrated device 50 having only two terminals 51 and 52. This integrated circuit 50 includes all of the circuit components as the integrated circuit 10 described above and illustrated in FIG. 1. In FIG. 2 components are given the same numerical designations plus 100 as the corresponding ones in FIG. 1. In addition, the integrated circuit 50 of FIG. 2 includes a modified current mirror circuit made up of transistor 54 that is connected as a diode, current sink transistor 55 and resistors 57 and 59.

Figure 3:
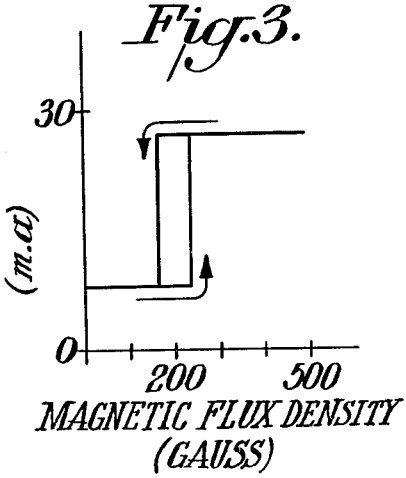
FIG. 3 shows a plot of the DC power supply current as a function of magnetic flux density for the sensor of FIG. 2.
Figure 4:
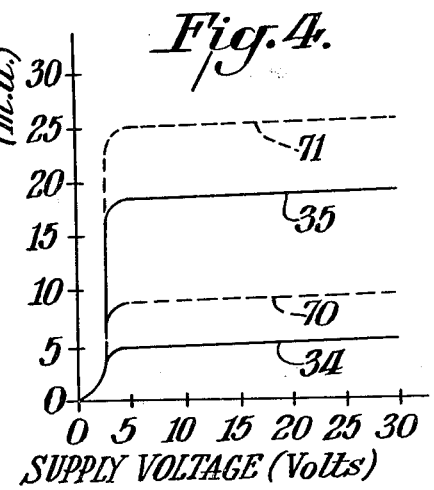
FIG. 4 shows a graph of the current drawn by the sensor of FIGS. 1 (solid lines) and 2 (broken lines) from the power supply, for high and low magnetic fields, as a function of the supply voltage.

The resistor 57 of about 2700 ohms is connected from the collector/base of transistor 54 to the buss 126 which provides a regulated 3.3 volts with respect to ground buss 124. Resistor 57 establishes a constant reference current 60 of about 1 milliampere through the transistor 54. The resistor 59 has a value of about 40 ohms. The flow of current 61 in the collector of transistor 55 is about 20 milliamperes. The ratio of reference current 60 to sink or load current 61 is about 1/20 over the broad range of DC power supply voltages of from 4.5 to 24 volts. When the ambient magnetic field is in a low range, i.e., less than about 165 gauss as indicated in FIG. 3, the total power supply current 65 is about 9 milliamperes, since for low fields the circuits 111, 112, 113 and that including transistor 115 draw about 8 ma., the current 60 is about 1 ma., and current 61 is zero. When the ambient field is greater than about 220 gauss, output current 65 can be around 26.5 milliamperes since circuits 111, 112, 113 and that including transistor 115 draw about 5.5 ma. and the currents 60 and 61 amount to about 21 ma. The broken line curve 70 in FIG. 4 represents the supply current 65 for the low magnetic field condition while broken line curve 71 respresents the current at the high magnetic field conditions as a function of supply voltage. The ratio of these currents 65 for the high and low field conditions, respectively, is 26.5/9, or about 3, providing a clear signal that may be reliably and simply detected at the power source even while the source voltage changes over a wide range.

What is claimed is:
1. A two terminal Hall-sensor comprising:
 (a) a Hall-element;
 (b) a threshold detector means being connected to the output of said Hall-element for providing two distinctly different output signals in response to a low and a high range of magnetic field ambients at said Hall-element, respectively;
 (c) a voltage regulator means for supplying a substantially constant DC voltage to said Hall-element and to said threshold detector;
 (d) a pair of DC voltage supply terminals being connected to the input of said voltage regulator; and
 (e) a constant current load means for drawing a substantially constant current of a predetermined value from said pair of DC voltage supply terminals in response to one of said detector means output signals and for drawing substantially less current in response to the other of said detector means output signals whereby the magnitude of the supply current flowing through said DC supply terminals provides unambiguous indications respectively of said high and low ambient magnetic field range.

2. The two terminal Hall-sensor of claim 1 wherein said constant current load means is comprised of a junction FET having the source connected to the gate, and further wherein the output circuit of said threshold detector means consists of a transistor switch that is open for one of said ranges of said magnetic field ambient and closed for the other of said magnetic field ambients, said switch and said FET being connected in series across said terminals.

3. The two terminal Hall-sensor of claim 1 wherein said constant current load means is comprised of a pair of transistors having a common base connection, a first of said transistors having a collector and emitter connected in series with a current limiting resistor across the output of said regulator means, and said second transistor being connected collector to emitter across said terminals, and further wherein the output circuit of said threshold detector means consists of a transistor switch that is open for one and closed for the other of said magnetic field ambients, said switch being connected across the base emitter junction of said second transistor to disable said constant current load means when said switch becomes closed.

4. The two terminal Hall-sensor of claim 1 wherein said Hall-element, threshold detector means, voltage regulator means, constant current load means, and said pair of DC voltage supply terminals are all incorporated in an integrated circuit.

5. The two terminal Hall-sensor of claim 4 wherein said two terminals are the only two terminals provided on said integrated circuit.

* * * * *